US011723283B2

United States Patent
Yu et al.

(10) Patent No.: US 11,723,283 B2
(45) Date of Patent: Aug. 8, 2023

(54) SPIN-ORBIT TORQUE MRAM STRUCTURE AND MANUFACTURE THEREOF

(71) Applicant: Applied Materials, Inc., Santa Clara, CA (US)

(72) Inventors: Minrui Yu, Santa Clara, CA (US); Wenhui Wang, San Jose, CA (US); Jaesoo Ahn, San Jose, CA (US); Jong Mun Kim, San Jose, CA (US); Sahil Patel, Santa Clara, CA (US); Lin Xue, San Diego, CA (US); Chando Park, Palo Alto, CA (US); Mahendra Pakala, Santa Clara, CA (US); Chentsau Chris Ying, Cupertino, CA (US); Huixiong Dai, Santa Clara, CA (US); Christopher S. Ngai, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 377 days.

(21) Appl. No.: 16/871,779

(22) Filed: May 11, 2020

(65) Prior Publication Data
US 2021/0351342 A1     Nov. 11, 2021

(51) Int. Cl.
*H10N 50/10*      (2023.01)
*G01R 33/09*      (2006.01)
(Continued)

(52) U.S. Cl.
CPC .......... *H10N 50/10* (2023.02); *G01R 33/095* (2013.01); *G01R 33/098* (2013.01);
(Continued)

(58) Field of Classification Search
CPC ....... H01L 43/08; H01L 27/222; H01L 43/04; H01L 43/10; H01L 43/14; G01R 33/095;
(Continued)

(56) References Cited

U.S. PATENT DOCUMENTS 8,467,235 B2   6/2013   Slonczewski
9,076,954 B2   7/2015   Khvalkovskiy et al.
(Continued)

FOREIGN PATENT DOCUMENTS

JP       2020035971 A      3/2020

OTHER PUBLICATIONS

PCT International Search Report and Written Opinion dated Aug. 10, 2021, for International Application No. PCT/US2021/029017.

*Primary Examiner* — Jami Valentine Miller
(74) *Attorney, Agent, or Firm* — Patterson + Sheridan, LLP

(57) ABSTRACT

Embodiments of the present disclosure generally include spin-orbit torque magnetoresistive random-access memory (SOT-MRAM) devices and methods of manufacture thereof. The SOT-MRAM devices described herein include an SOT layer laterally aligned with a magnetic tunnel junction (MTJ) stack and formed over a trench in an interconnect. Thus, the presence of the SOT layer outside the area of the MTJ stack is eliminated, and electric current passes from the interconnect to the SOT layer by SOT-interconnect overlap.
(Continued)

The devices and methods described herein reduce the formation of shunting current and enable the MTJ to self-align with the SOT layer in a single etching process.

10 Claims, 10 Drawing Sheets

(51) Int. Cl.
    *G11C 11/16* (2006.01)
    *H10B 61/00* (2023.01)
    *H10N 50/85* (2023.01)
    *H10N 52/01* (2023.01)
    *H10N 52/80* (2023.01)

(52) U.S. Cl.
    CPC ............ *G11C 11/161* (2013.01); *H10B 61/00* (2023.02); *H10N 50/85* (2023.02); *H10N 52/01* (2023.02); *H10N 52/80* (2023.02)

(58) Field of Classification Search
    CPC .... G01R 33/098; G11C 11/161; H10N 50/10; H10N 52/01; H10N 52/80; H10N 50/85; H10B 61/00
    USPC .......................................................... 257/421
    See application file for complete search history.

(56) References Cited

U.S. PATENT DOCUMENTS

| | | |
|---|---|---|
| 9,082,497 B2 | 7/2015 | Suzuki |
| 9,953,692 B1 | 4/2018 | Mihajlovic et al. |
| 10,381,552 B2 | 8/2019 | Mihajlovic et al. |
| 10,497,858 B1 | 12/2019 | Ahn et al. |
| 10,546,622 B2 | 1/2020 | Chen et al. |
| 2009/0224341 A1* | 9/2009 | Li ............................ H01L 43/12 257/E43.001 |
| 2009/0243009 A1* | 10/2009 | Li .......................... H01L 27/228 257/422 |
| 2016/0380189 A1 | 12/2016 | Ohsawa et al. |
| 2018/0006085 A1* | 1/2018 | Chuang ................. H01L 27/228 |
| 2018/0040813 A1* | 2/2018 | Han ........................ H01L 43/08 |
| 2018/0308536 A1 | 10/2018 | Buhrman et al. |
| 2020/0083429 A1* | 3/2020 | Lee ........................ H01L 27/228 |
| 2020/0136018 A1 | 4/2020 | Ying et al. |
| 2020/0161542 A1 | 5/2020 | Ahn et al. |
| 2020/0227626 A1 | 7/2020 | Lee et al. |
| 2021/0005807 A1* | 1/2021 | Kwon ..................... H01L 43/08 |

* cited by examiner

SPIN-ORBIT TORQUE MRAM STRUCTURE AND MANUFACTURE THEREOF

BACKGROUND

Field

Embodiments of the present disclosure generally relate to methods for fabricating structures used in magnetoresistive random-access memory (MRAM) applications. More specifically, embodiments of the present disclosure relate to methods for fabricating magnetic tunnel junction structures for spin-orbit torque MRAM (SOT-MRAM) applications.

Description of the Related Art

Magnetoresistive random-access memory (MRAM) is a type of memory device containing an array of MRAM cells that store data using resistance values of MRAM cells instead of electronic charges. Generally, each MRAM cell includes a magnetic tunnel junction (MTJ) structure that may have an adjustable resistance to represent a logic state "0" or "1." The MTJ structure typically includes a stack of magnetic layers having a configuration in which two ferromagnetic layers are separated by a thin non-magnetic dielectric layer, e.g., an insulating tunneling layer. A top electrode and a bottom electrode are utilized to sandwich the MTJ structure so electric current may flow between the top and the bottom electrode.

One ferromagnetic layer, e.g., a reference layer, is characterized by a magnetization with a fixed direction. The other ferromagnetic layer, e.g., a storage layer, is characterized by a magnetization with a direction that is changeable upon writing of the device, such as by applying a magnetic field. In some devices, an insulator material layer, such as a dielectric oxide layer, may be formed as a thin tunneling barrier layer sandwiched between the ferromagnetic layers. The layers are typically deposited sequentially as overlying blanketed films. The ferromagnetic layers and the insulator material layer are subsequently patterned by various etching processes in which one or more layers are removed, either partially or totally, in order to form a device feature.

When the respective magnetizations of the reference layer and the storage layer are antiparallel, a resistance of the magnetic tunnel junction is high having a resistance value $R_{max}$ corresponding to a high logic state "1". On the other hand, when the respective magnetizations are parallel, the resistance of the magnetic tunnel junction is low, namely having a resistance value $R_{min}$ corresponding to a low logic state "0". A logic state of an MRAM cell is read by comparing its resistance value to a reference resistance value $R_{ref}$, which is derived from a reference cell or a group of reference cells and represents an in-between resistance value between that of the high logic state "1" and the low logic state "0".

MRAM can take various forms, including spin-transfer torque (STT) MRAM in which a spinning direction of the electrons is reversed using a spin-polarized current. The spin-polarized current is applied to STT-MRAM devices in an in-plane direction or a perpendicular direction relative to the MTJ stack. However, STT MRAM cannot consistently operate at sub-nanosecond (ns) regimes due to incubation delays, and the shared read and write terminals and large write voltage of STT MRAM limit reliability and endurance thereof.

In contrast, spin-orbit torque (SOT) MRAM causes the switching of the spinning direction of the electrons by applying a current to a heavy metal layer, or spin-orbit torque (SOT) layer, adjacent the MTJ stack. The current is applied to the SOT layer in an in-plane direction relative to the MTJ stack which enables faster writing (e.g., sub-ns switching). Furthermore, the independent read and write paths of SOT-MRAM devices provide increased endurance and device stability. Despite the aforementioned advantages, fabrication of SOT-MRAM devices can be challenging since conventional SOT-MRAM structures may exhibit current flow loss due to a mismatch in size between the MTJ stack and SOT layer. This lost current flow, otherwise known as shunting current, wastes power and can cause Joule heating. Additionally, top-pinned SOT-MRAM device structures utilize the SOT layer as an etch stop, which can negatively impact the quality of the SOT layer, thus negatively affecting overall device performance.

Accordingly, there is a need in the art for improved SOT-MRAM device structures and methods of manufacture thereof.

SUMMARY

The present disclosure generally relates to spin-orbit torque magnetoresistive random-access memory (SOT-MRAM) devices and methods of manufacture thereof.

In one embodiment, a magnetoresistive random-access memory (MRAM) device structure includes a bottom electrode having a gap therein, the gap separating a first structure and a second structure of the bottom electrode; a conductive channel formed over the gap and having an area overlapping each of the first and the second structures of the bottom electrode; and, a magnetic tunnel junction (MTJ) pillar structure disposed over the conductive channel, the MTJ pillar having a sidewall aligned with a sidewall of the conductive channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally include spin-orbit torque magnetoresistive random-access memory (SOT-MRAM) devices and methods of manufacture thereof. SOT-MRAM devices rely on inducing spin current (i.e., SOT) via spin-orbit coupling in a free magnetic layer by applying an in-plane electric current to an adjacent SOT or channel layer. Thus, it is desirable to have all electric current passing through the SOT layer to pass under a magnetic tunnel junction (MTJ) of an SOT-MRAM device in order to maximize the Spin Hall effect and induce spin accumulation.

Conventional SOT-M RAM devices, however, can experience electric current flow loss in the form of shunting current, which includes electric current passing through the SOT layer and nonadjacent to the MTJ stack. Shunting current may be generated when a width of the SOT layer is greater than a width of the MTJ stack and/or when a total depth of the SOT layer is greater than an effective SOT depth, enabling electric current to pass through the SOT layer remote from the MTJ stack. Shunting current wastes power and causes Joule heating, therefore reducing switching efficiency of SOT-MRAM devices and negatively impacting thermal stability thereof.

Additionally, conventional methods of fabrication of SOT-MRAM devices can be challenging, for example, because of defects that can occur in the SOT layer. Defects in the SOT layer can occur, for example, when the SOT layer is utilized as an etch stop during etching of the MTJ stack. Defects in the SOT layer can negatively impact the quality of the SOT layer and thus, negatively impact the magnetic and electrical properties of the overall SOT-M RAM device.

The SOT-MRAM devices described herein include an SOT layer laterally aligned with a magnetic tunnel junction (MTJ) stack and formed over a spacer disposed between interconnect structures. The elimination of the SOT layer outside the area of the MTJ stack causes electric current to pass from the interconnect to the SOT layer by SOT-interconnect overlap, reducing or eliminating the formation of shunting current. Additionally, the patterning of the MTJ stack and the SOT layer in a single etch process enables self-alignment of the MTJ with the SOT layer and reduces the formation of defects in the SOT layer caused when using the SOT layer as an etch stop.

The use of "substantially" or "about" herein should be understood to mean within +/−10% of the corresponding value or amount.

Figure 1:
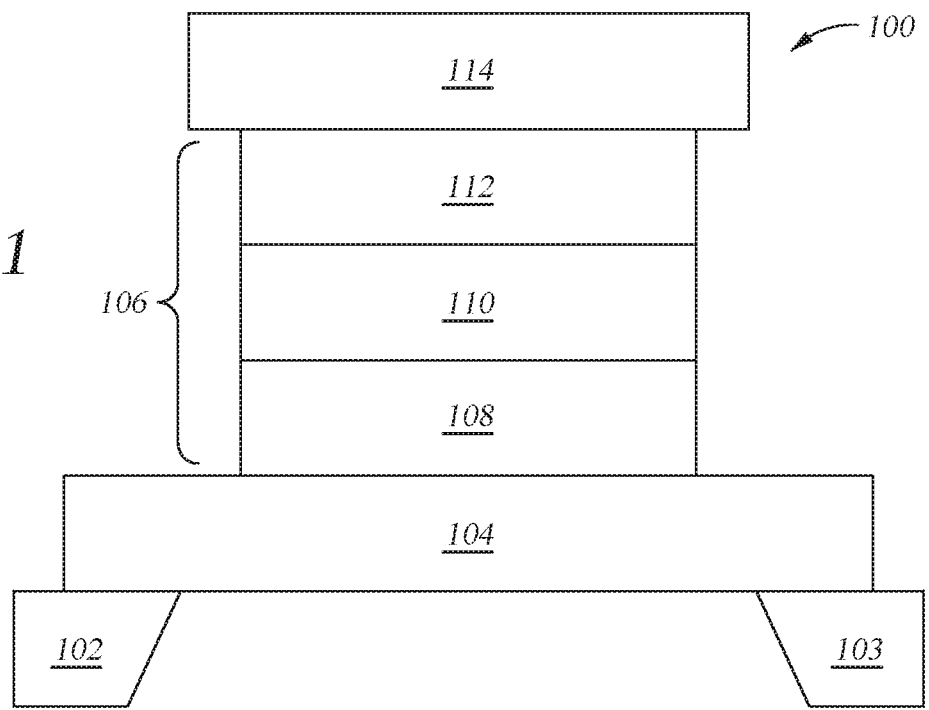
FIG. 1 illustrates a cross-sectional side view of an exemplary spin-orbit torque magnetoresistive random-access memory (SOT-MRAM) device according to embodiments of the present disclosure.

FIG. 1 illustrates a cross-sectional view of a conventional spin-orbit torque MRAM (SOT-MRAM) device 100. The SOT-MRAM device 100 in FIG. 1 includes an MTJ stack 106 formed on an SOT layer 104, which acts as a conductive channel for electrical current provided from first interconnect structures 102 and 103. The MTJ stack 106 includes a free layer 108 having a free magnetization, a reference layer 112 having a fixed or pinned magnetic moment, and a tunnel barrier layer 110 used to decouple the aforementioned magnetic layers. The free layer 108 is in direct contact with the SOT layer 104 and the tunnel barrier 110. The reference layer 112 directly contacts the tunnel barrier 110 and has a second interconnect structure 114 formed thereover. Although not shown in FIG. 1, one or more additional layers may be formed between the reference layer 112 and the second interconnect structure 114. Altogether, the free layer 108, tunnel barrier layer 110, and reference layer 112 are configured such that, electrical current through the tunnel barrier layer 110 is low when the directions of electron spin polarizations of the reference layer 112 and the free layer 108 are aligned in parallel, resulting in a low-resistance state of the MTJ stack 106. When the polarization directions of the reference layer 112 and the free layer 108 are anti-parallel, electrical resistance of the MTJ stack 106 increases.

Figure 2A:
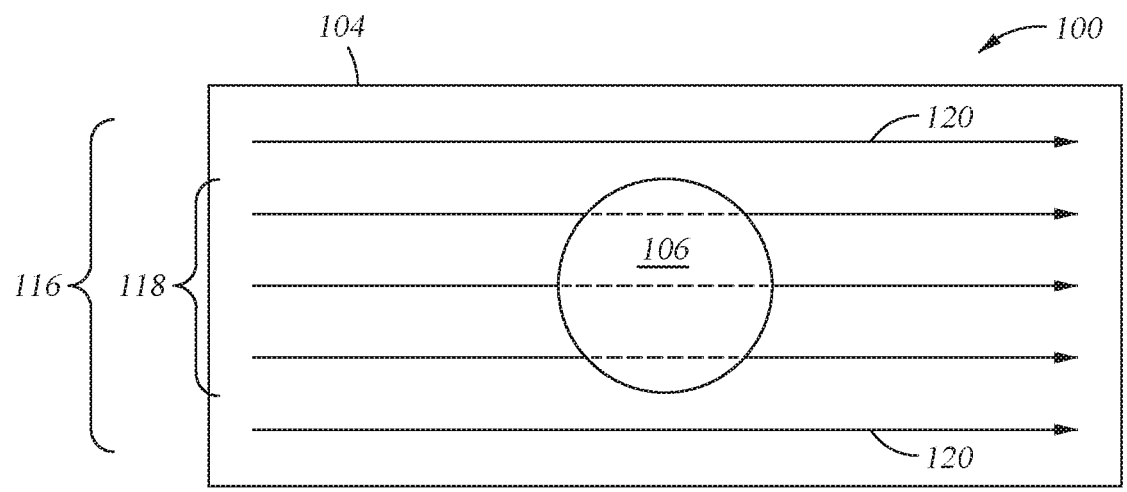
FIG. 2A illustrates a schematic top view of an exemplary magnetic tunnel junction (MTJ) of an SOT-MRAM device according to embodiments of the present disclosure.
Figure 2B:
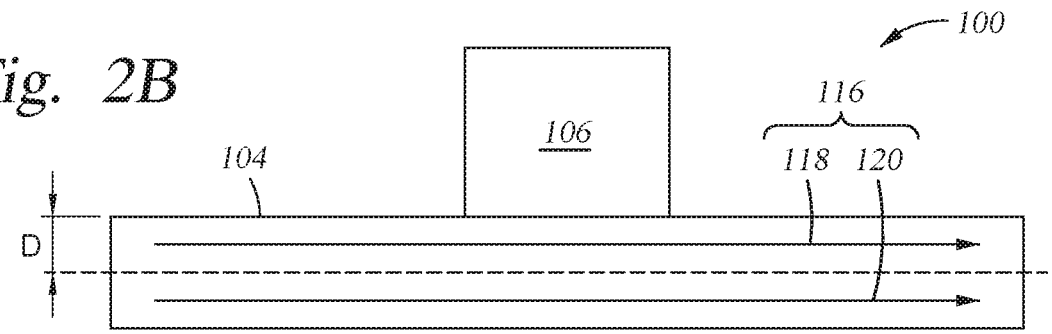
FIG. 2B illustrates a schematic cross-sectional side view of the MTJ of FIG. 2A according to embodiments of the present disclosure.

FIGS. 2A and 2B illustrate the flow of electric current 116 through the SOT layer 104 of the SOT-MRAM device 100. FIG. 2A illustrates a schematic top view of a portion of the SOT-MRAM device 100, while FIG. 2B illustrates a schematic cross-sectional side view of the SOT-M RAM device 100. Accordingly, FIGS. 2A and 2B will be herein described together for clarity.

As depicted in FIG. 2A, the electric current 116 flowing through the SOT layer 104 includes effective electric current 118 passing directly below the MTJ stack 106 and shunting current 120 passing outside the area of the MTJ stack 106. Because the effective electric current 118 flows directly under the MTJ stack 106 and in close proximity thereof, the effective electric current 118 contributes to the switching of the free layer 108. Shunting current 120, however, due to the remoteness thereof from the MTJ stack 106, is drawn through a path parallel to that of the effective electric current 118 but has no effect on the spin-orbit coupling of the free layer 108 and may thus be described as lost current. Not only does shunting current 120 effectively reduce the Spin Hall effect, but it also generates Joule heating that makes switching undetectable.

Similarly, as depicted in FIG. 2B, the SOT layer 104 has an effective depth D from a lower end of the MTJ stack 106 within which the electric current 116 will have an effect on (e.g., contribute to) switching of the SOT-MRAM device 100. Current flowing within the effective depth D, and directly below the MTJ stack 106, is effective electric current 118, and thus, contributes to the switching of the free layer 108 of the SOT-MRAM device 100. Current flowing below the effective depth D and/or outside the area of the MTJ stack 106 is shunting current 120, which is undesirable as described above.

Figure 3A:
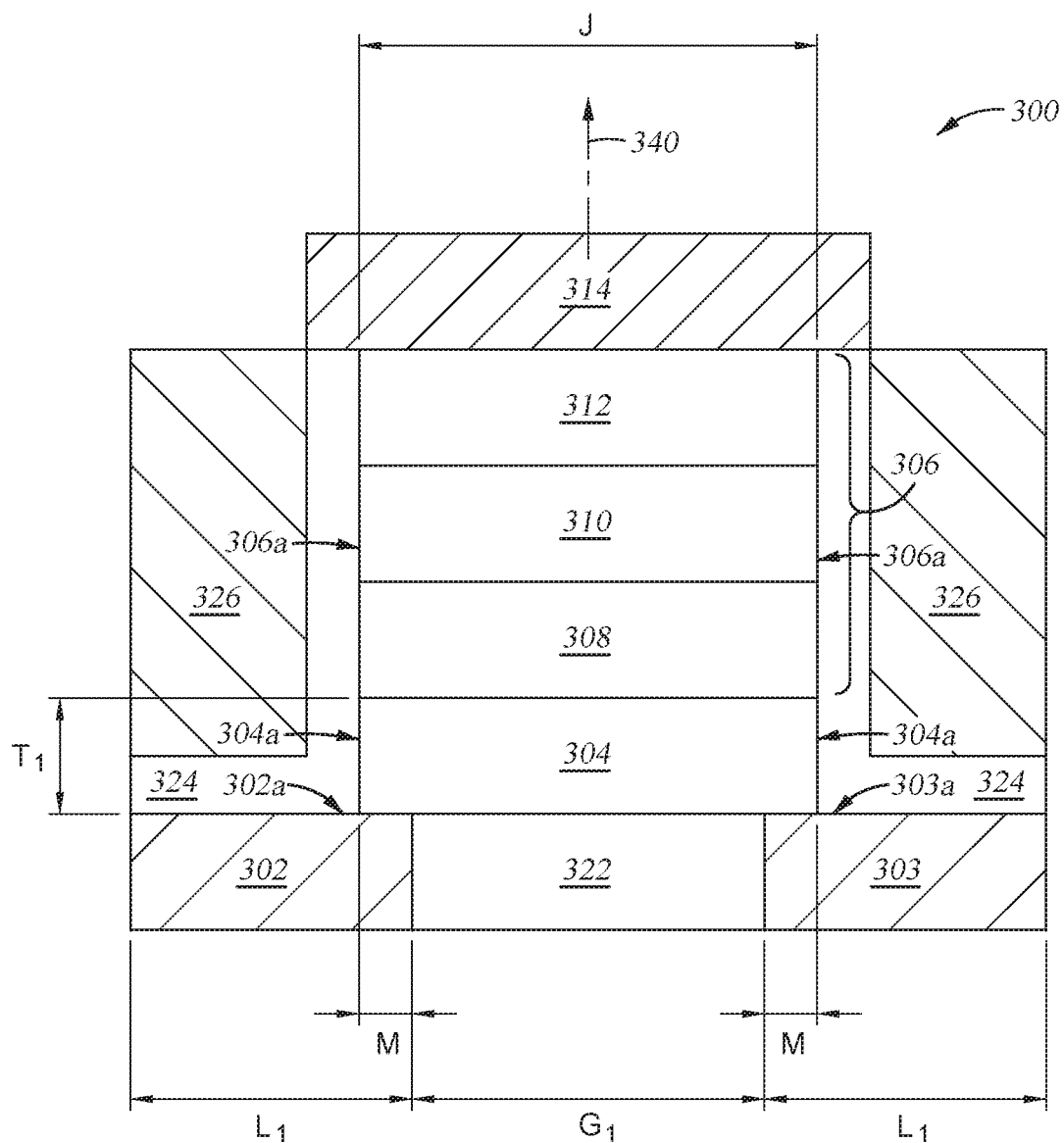
FIG. 3A illustrates a cross-sectional side view of an SOT-MRAM device fabricated according to embodiments of the present disclosure.
Figure 3B:
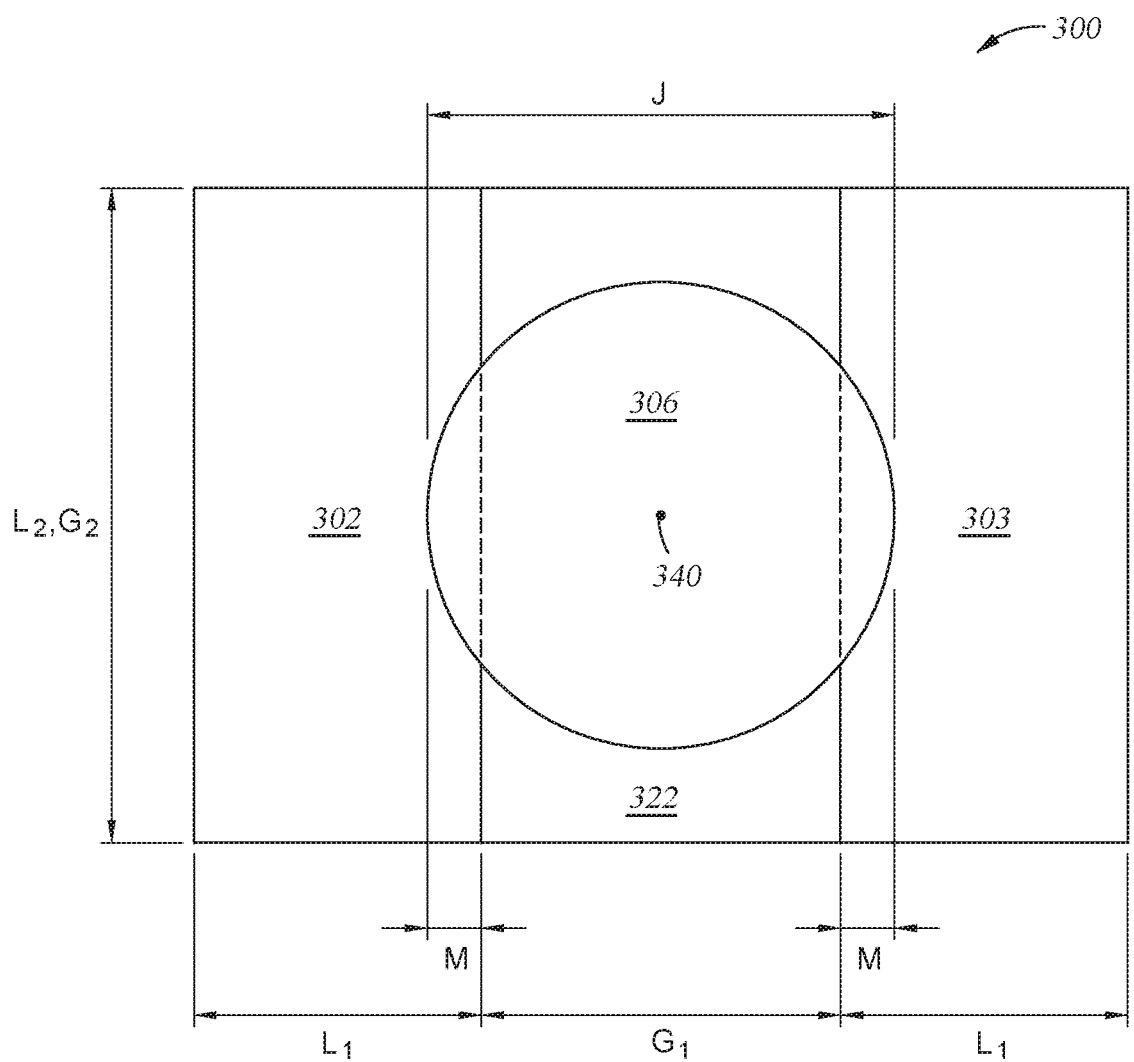
FIG. 3B illustrates a top view of a portion of the SOT-MRAM device of FIG. 3A according to embodiments of the present disclosure.

FIGS. 3A and 3B illustrate an SOT-MRAM device 300 fabricated according to embodiments of the present disclosure. The SOT-MRAM device 300 has decreased current flow loss and improved switching efficiency as compared to conventional SOT-MRAM devices. FIG. 3A illustrates a cross-sectional side view of the SOT-MRAM device 300, while FIG. 3B illustrates a top view of a portion of the SOT-M RAM device 300. Accordingly, FIGS. 3A and 3B will be herein described together for clarity.

The SOT-MRAM device 300 includes an MTJ stack 306 formed over an SOT layer 304 and first interconnect structures 302 and 303. The first interconnect structures 302 and 303 can be referred to as a metal line, metal lines, or a bottom electrode, since the conductive first interconnect structures 302 and 303 electrically couple to the SOT layer 304 and act to transfer current through the SOT layer 304. In certain embodiments, the first interconnect structures 302 and 303 are formed from copper (Cu), tungsten (W), tantalum (Ta), tantalum nitride (TaN), titanium (Ti), titanium nitride (TiN), combinations thereof, or the like. The first interconnect structures 302 and 303 have a first lateral dimension (e.g., length or width) $L_1$ and a second lateral dimension $L_2$ (shown in FIG. 3B), the second later dimension $L_2$ substantially equal to or about equal to a width J of the SOT layer 304 and the MTJ stack 306. In certain embodiments, lateral dimensions $L_1$ and/or $L_2$ are substantially equal to or greater than about 20 nm, such as at least about 25 nm or about 30 nm. Furthermore, in certain embodiments, the lateral dimensions $L_1$ and $L_2$ are substantially the same. The dimensions of the first interconnect structures 302 and 303 are selected based on a desired amount of current to be transferred through the SOT layer 304 and the electrical characteristics of the SOT layer 304 and the MTJ stack 306.

The first interconnect structures 302 and 303 are separated from each other by a spacer 322 having a first lateral dimension $G_1$ and a second lateral dimension $G_2$ substantially equal to or about equal to a lateral dimension $L_2$ (shown in FIG. 3B) of the first interconnect structures 302 and 303. In certain embodiments, the first lateral dimension $G_1$ is substantially equal to or greater than about 20 nm, such as at least about 25 nm or about 30 nm. The lateral dimensions of the spacer 322 are selected based on the dimensions of the SOT layer 304 such as the width J, as well as the desired amount of current to be transferred through the SOT layer 304 and the electrical characteristics of the SOT layer 304 and the MTJ stack 306. The spacer 322 can be referred to as a spacer layer, gap, or a gap layer, since the spacer 322 physically and electrically separates the first interconnect structures 302 and 303, thus enabling current to be transferred through the SOT layer 304. In certain embodiments, the spacer 322 comprises a gap-fill material such as a dielectric material. Examples of suitable dielectric materials that may be utilized for the spacer 322 include oxides such as silicon dioxide ($SiO_2$) and metal oxides (e.g., aluminum oxide ($Al_2O_3$), nitrides such as silicon nitride ($Si_3N_4$) or silicon carbonitride (SiCN), combinations of oxides and nitrides such as silicon oxynitride ($N_2OSi$), and the like. In various examples, the spacer 322 can be formed in-situ where the SOT layer 304 is formed. In another example, the spacer 322 is formed in a different process chamber (ex-situ) than the process chamber used to form the SOT layer 304

The SOT layer 304 is deposited over the spacer 322 and the first interconnect structures 302 and 303. The SOT layer 304 has a thickness $T_1$ and a width (e.g., diameter) J that is substantially equal to a width of the MTJ stack 306 such that sidewalls 304a of the SOT layer 304 are aligned with sidewalls 306a of the MTJ stack 306. Thus, it can be said that the SOT layer 304 and the MTJ stack 306 share a central axis 340 and/or have a common width J. The width J is between about 100 Angstroms and about 1500 Angstroms, such as between about 100 Angstroms and about 1000 Angstroms, such as between about 250 Angstroms and about 750 Angstroms. The width J is greater than a first lateral dimension $G_1$ of the spacer 322 such that an area of the SOT layer 304 overlaps each first interconnect structure 302 and 303 by at least a distance M. The distance M can be from about 1 Angstrom to about 300 Angstroms, such between about 20 Angstroms and about 200 Angstroms, such as between about 40 Angstroms and about 100 Angstroms. For example, the distance M can be about 50 Angstroms. Generally, the distance M is minimized to increase the active area of the SOT layer 304 and reduce the resistance thereof. Depending upon the example, the thickness $T_1$ of the SOT layer 304 can be from about 3 mm thick to about 10 mm thick. In certain embodiments, the SOT layer 304 is formed from suitable heavy metals. For example, the SOT layer 304 is formed from tungsten (W), tantalum (Ta), platinum (Pt), combinations thereof, alloys thereof, or the like.

The MTJ stack 306 is deposited over the SOT layer 304 and includes a free layer 308 having a free magnetization, a reference layer 312 having a fixed magnetization, and a tunnel barrier layer 310 disposed therebetween. The free layer 308 is in direct contact with the SOT layer 304 and the tunnel barrier layer 310. The free layer 308 can be formed as a single layer or as a plurality of interlayers. In certain embodiments, the free layer 308 is formed from magnetic materials such as cobalt (Co), iron (Fe), boron (B), magnesium (Mg), magnesium oxide (Mg), combinations thereof, alloys thereof, or the like. In one example, the free layer 308 is formed from CoFeB—MgO.

The tunnel barrier layer 310 can be formed as a single layer or as a plurality of interlayers. In certain embodiments, the tunnel barrier layer 310 is formed of one or more oxides. For example, the tunnel barrier layer 310 can be formed of MgO. The tunnel barrier layer 310 has a thickness between about 1 and about 25 Angstroms, such as between about 10 and about 20 Angstroms.

The reference layer 312 is deposited over the tunnel barrier layer 310 and can be formed as a single layer or as a plurality of interlayers. In certain embodiments, the reference layer 312 is formed of CoFe, CoFeB, FeB, Ta, molybdenum (Mo), ruthenium (Ru), combinations thereof, alloys thereof, or the like.

Depending upon the example, each of the free layer 308, tunnel barrier layer 310, and the reference layer 312 can be a single layer or can include interlayers. In some examples of the MTJ stack 306, additional layers can be included between the free layer 308 and the SOT layer 304 and between the reference layer 312 and a second interconnect structure 314 (described below in further detail) disposed thereon. For example, the MTJ stack 306 may include a metal pinning layer disposed between the reference layer 312 and the second interconnect structure 314, such as a Co or Pt pinning layer.

Although FIG. 3B illustrates the MTJ stack 306 (and thus, the SOT layer 304 disposed below) to have a circular cross-section from the top-down, it is contemplated in other examples that the cross-sectional geometry of the top-view that includes the MTJ stack 306 and the SOT layer 304 can be an ellipse, polygon, triangle, or other shape or combination of shapes that can be aligned in various manners over the spacer 322 and the first interconnect structures 302 and 303. Furthermore, FIG. 3B is used to illustrate the position of the SOT layer 304 relative to the first interconnect structures 302 and 303. Conventionally, if the SOT layer 304 is misaligned with a metal layer, current loss can occur. However, in examples of SOT-MRAM devices discussed herein, as long as the SOT layer 304 overlaps with each of the first interconnect structures 302 and 303, current loss associated with misalignment is significantly reduced or eliminated. The SOT-MRAM device 300 transmits current through the SOT layer 304 via the first interconnect structures 302 and 303 that are electrically coupled to one another via only the SOT layer 304, which reduces or eliminates current loss and increases the switching efficiency of the SOT-MRAM device 300.

The structures previously described with reference to FIG. 3A are formed in part by etching a target stack including the MTJ stack 306, the SOT layer 304, and the first interconnect structures 302 and 303 having the spacer 322 disposed therebetween. In certain embodiments, the SOT-MRAM device 300 further includes an encapsulation layer 324 extending circumferentially around the SOT layer 304 and the MTJ stack 306. The encapsulation layer 324 is formed to cover sidewalls 306a of the MTJ stack 306 and a sidewall 304a of the SOT layer 304. In some examples, the encapsulation layer 324 further extends along top surfaces 302a and 303a of the first interconnect structures 302 and 303, respectively. The encapsulation layer 324 acts to protect the MTJ stack 306 and the SOT layer 304 from subsequent patterning processes. The encapsulation layer 324 further acts to separate the first interconnect structures 302 and 303 from a subsequently formed dielectric fill layer 326. The encapsulation layer 324 can be formed of one or more dielectric materials such as silicon nitride (SiN), silicon carbonitride (SiCN), silicon oxynitride (SiON), aluminum oxide ($Al_2O_3$), and/or the like.

The dielectric fill layer 326 is formed to encompass the encapsulation layer 326 disposed around the MTJ stack 306 and the SOT layer 304. In certain embodiments, the dielectric fill layer 326 comprises a gap-fill material such as a dielectric material. Examples of suitable dielectric materials that may be utilized for the dielectric fill layer 326 include low temperature oxides, nitrides, combinations of oxides and nitrides, and the like. In various examples, the dielectric fill layer 326 can be formed in-situ when the SOT layer 304 and MTJ stack 306 are formed. In another example, the dielectric fill layer 326 is formed in a different process chamber (ex-situ) than the process chamber used to form the SOT layer 304 and the MTJ stack 306.

The second interconnect structure 314 is formed over the reference layer 312 of the MTJ stack 306. Similar to the first interconnect structures 302 and 303, the second interconnect structure 314 can be referred to as a metal line, metal lines, or a top electrode, since the second interconnect structure 314 electrically couples to the reference layer 312 and acts to transfer current thereto. In certain embodiments, the second interconnect structure 314 is formed from copper (Cu), tungsten (W), tantalum (Ta), tantalum nitride (TaN), titanium (Ti), titanium nitride (TiN), combinations thereof, or the like.

The SOT-M RAM devices discussed herein can be fabricated in various manners. Example methods and structures resulting from those methods are described below. Various elements of the methods below can be combined and utilized to form the SOT-MRAM structures described herein. FIGS. 4 and 5A-5G discuss various fabrication operations and sub-operations used to fabricate SOT-MRAM device structures, as well as structure resulting therefrom. It is contemplated that elements of methods discussed herein can be combined to form SOT-MRAM devices with high-quality MTJ stack/SOT layer interfaces and commercially viable magnetic and electrical properties.

Figure 4:
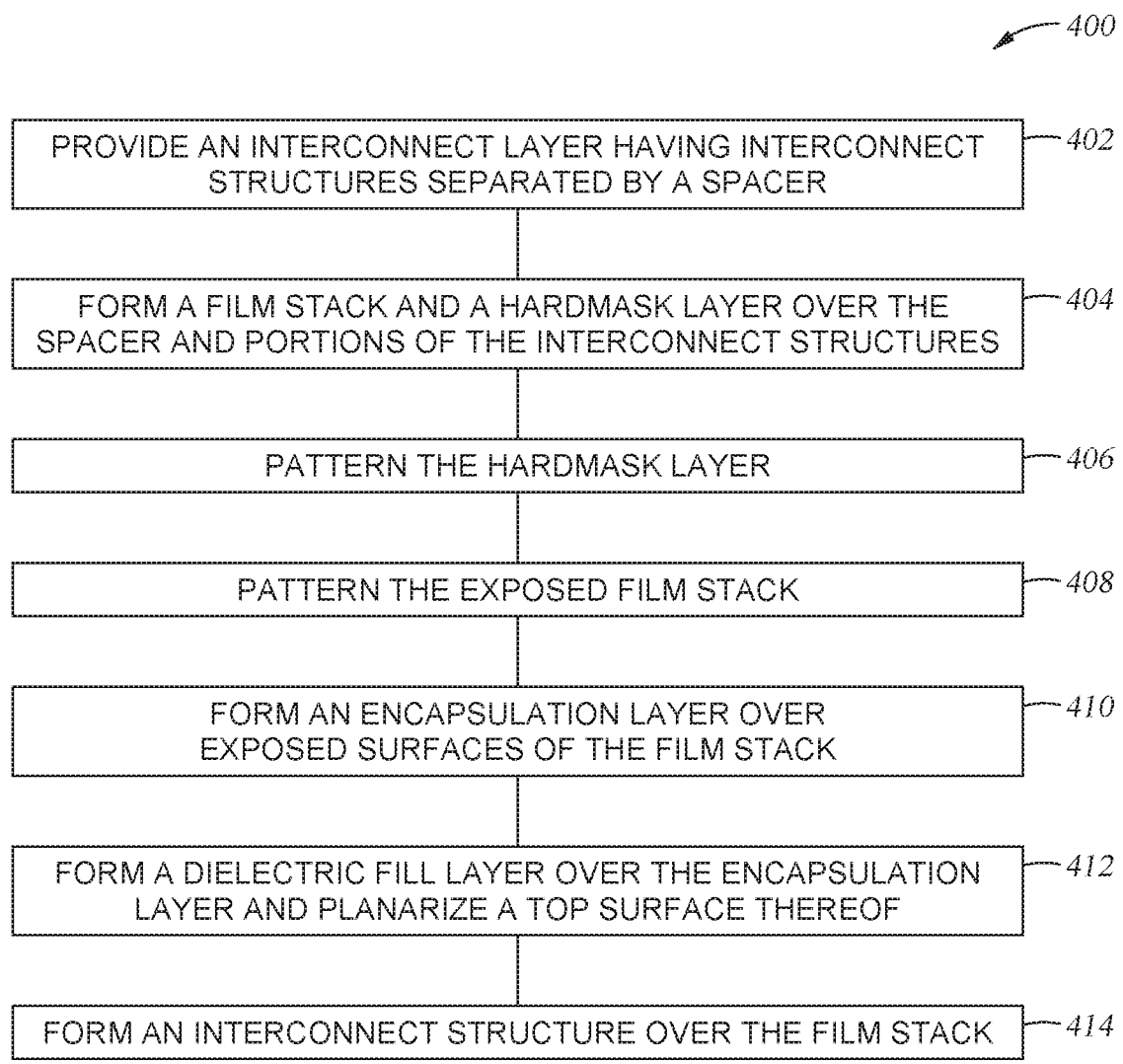
FIG. 4 illustrates a flow chart of a method of fabricating SOT-MRAM devices according to embodiments of the present disclosure.

FIG. 4 is a flowchart of a fabrication method 400 for SOT-MRAM according to embodiments of the present disclosure. The method 400 has multiple operations. The method may include one or more additional operations which are carried out before any of the defined operations, between two of the defined operations, or after all of the defined operations (except where the context excludes the possibility). FIGS. 5A-5G illustrate structures resulting from operations of the fabrication 400. Thus, FIGS. 4 and 5A-G are discussed together below and are directed towards forming an SOT-MRAM structure substantially similar to the SOT-M RAM device 300 of FIG. 3.

Figure 5A:
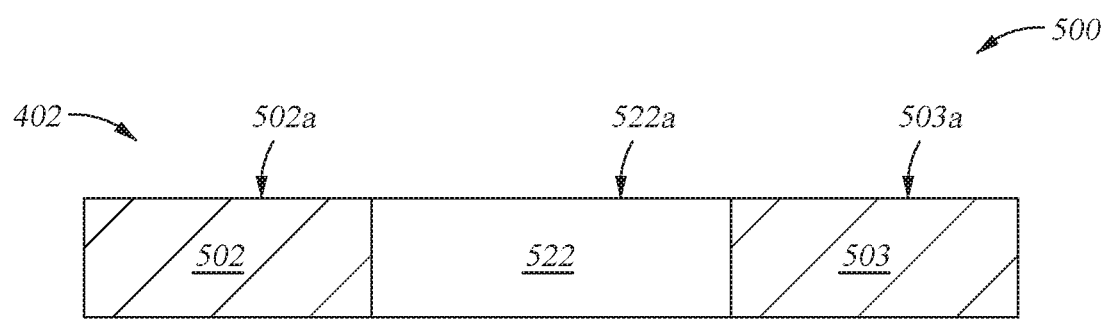
FIGS. 5A-5G illustrate SOT-MRAM device structures at different stages of the method depicted in FIG. 4 according to embodiments of the present disclosure.

The process begins at operation 402 by providing a bottom electrode or interconnect structure, such as interconnect layer 500, having first interconnect structures 502 and 503 separated by a spacer 522 as shown in FIG. 5A. The interconnect layer 500 may be formed in-situ or ex-situ (with or without breaking vacuum) in relation to the remaining operations of the method 400. For example, the interconnect layer 500 may be formed in one or more processing chambers incorporated in a cluster processing system suitable for manufacturing of SOT-MRAM structures. In certain embodiments, the interconnect layer 500 is formed on a base (not shown), such as a substrate comprising metal or glass, silicon, dielectric bulk material and metal alloys or composite glass, crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The base may have various dimensions, such as 200 mm, 300 mm, 450 mm, or other diameters or widths, and may also be a rectangular or square panel.

As described above, the first interconnect structures 502 and 503 are formed from Cu, W, Ta, TaN, Ti, TiN, aluminum (Al), nickel (Ni), combinations thereof, or the like. The spacer 522 is formed from a gap-fill material, such as a dielectric material. Examples of suitable dielectric materials include oxides such as $SiO_2$ and $Al_2O_3$, nitrides such as $Si_3N_4$, combinations of oxides and nitrides such as $N_2OSi$, and the like. In certain embodiments, the spacer 522 is formed of SiN, SiCN, SiON, SiC, amorphous carbon, silicon oxycarbide (SiOC), combinations thereof, and the like. The spacer 522 may be formed using physical vapor deposition (PVD), chemical vapor deposition (CVD), or other suitable methods or combinations thereof. Further, the spacer 522 may be planarized to remove a portion thereof via chemical mechanical polishing (CMP) such that a top surface 522a of the spacer 522 is co-planar with top surfaces 502a and 503a of the first interconnect structures 502 and 503, respectively.

Figure 5B:
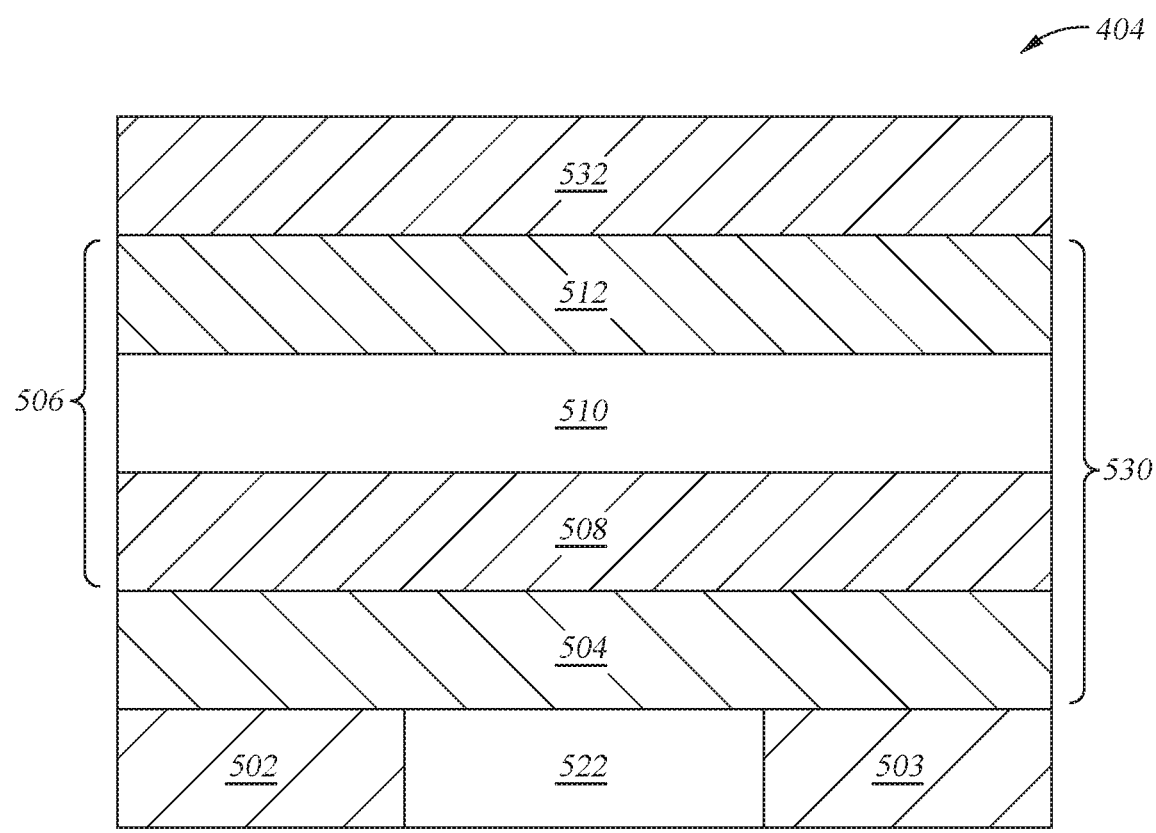

At operation 404, a film stack 530 and a hardmask layer 532 are disposed over the interconnect layer 500, as shown in FIG. 5B. The film stack 530 and the hardmask layer 532 may be formed in the same or different processing chamber as the interconnect layer 500. The film stack 530 includes an SOT layer 504, a free layer 508 having a free magnetization, a reference layer 512 having a fixed or pinned magnetic moment, and a tunnel barrier layer 510 used to decouple the free layer 508 and the reference layer 512. The free layer 508, the tunnel barrier layer 510, and the reference layer 512 may together be referenced as MTJ stack 506. Though the film stack 530 described with reference to FIGS. 4 and 5A-G only includes four layers, it is noted that additional or multiple film layers can be further formed in the film stack 530 as desired.

The SOT layer 504 is deposited over the interconnect layer 500 via any suitable deposition process. In certain embodiments, the SOT layer 504 is deposited over the interconnect layer 500 via PVD sputtering. The SOT layer 504 is formed over the interconnect layer 500 such that a lateral area of the SOT layer 504 overlaps with the spacer 522 as well as each of the first interconnect structures 502 and 503. As described above, the SOT layer 504 is formed from suitable heavy metals, such as W, Ta, Pt, or combinations or alloys thereof. Depending upon the example, a thickness of the SOT layer 504 can be from about 3 mm to about 10 mm.

Similarly, the MTJ stack 506 can be formed over the SOT layer 504 in a series of PVD sputtering sub-operations without breaking vacuum in between the formation of the individual layers thereof and/or in between formation of the SOT layer 504 and the MTJ stack 506. Accordingly, each of the free layer 508, the tunnel barrier layer 510, and the reference layer 512, are formed in a process chamber held under vacuum pressure. Maintaining vacuum between fabrication of the various layers promotes formation of high quality interfaces therebetween. One or more sputtering targets can be used in the PVD operations to form the MTJ stack 506. For example, the free layer 508 is formed via PVD sputtering from Co, Fe, B, Mg, or MgO, or via PVD sputtering from Mg and subsequent oxidation. The tunnel barrier layer 510 is formed via PVD sputtering from MgO, or via PVD sputtering from Mg and subsequent oxidation. The reference layer 512 is formed via PVD sputtering from Co, Fe, B, Ta, Mo, Ru, or combinations thereof.

The hardmask layer 532 is formed over the film stack 530 and is later utilized as an etching mask layer during subsequent pattering and/or etching processes. The hardmask layer 532 is from any suitable material, including CoFeB, MgO, Ta, W, Pt, copper bismuth (CuBi), Mo, Ru, iridium (Ir), alloys thereof, or combinations thereof.

Figure 5C:
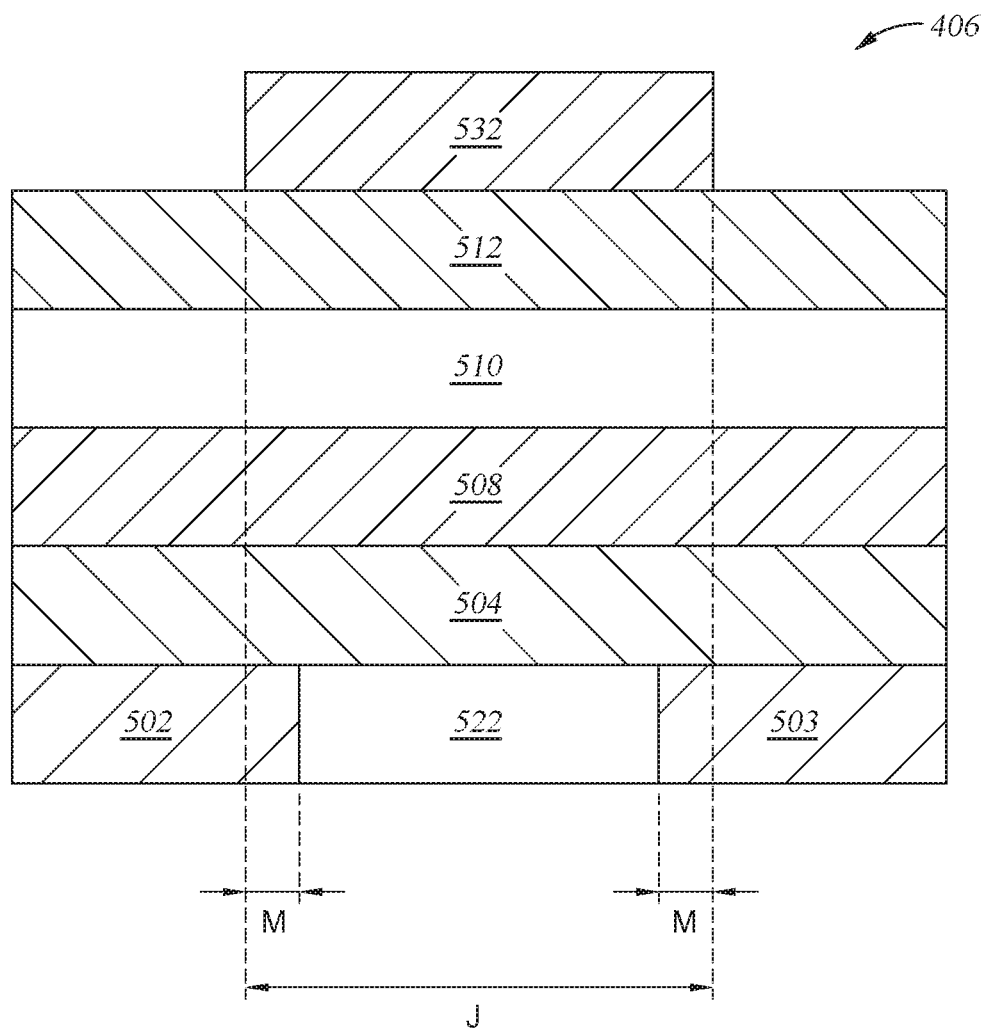

At operation 406 and FIG. 5C, a first patterning process (e.g., an etching process) is performed to pattern the hardmask layer 532. The hardmask layer 532 is patterned to have substantially equal or about equal lateral dimensions to the subsequently etched MTJ stack 506 and SOT layer 504 (e.g., a width J). Thus, after patterning, the hardmask layer 532 is disposed over the spacer 522 and overlaps each of the first interconnect structures 502 and 503 by a distance M between about 1 Angstrom to about 100 Angstroms, such between about 20 Angstroms and about 80 Angstroms, such as between about 40 Angstroms and about 60 Angstroms. For example, the hardmask layer 532 overlaps each of the first interconnect structures 502 and 503 by a distance M of about 50 Angstroms.

Figure 5D:
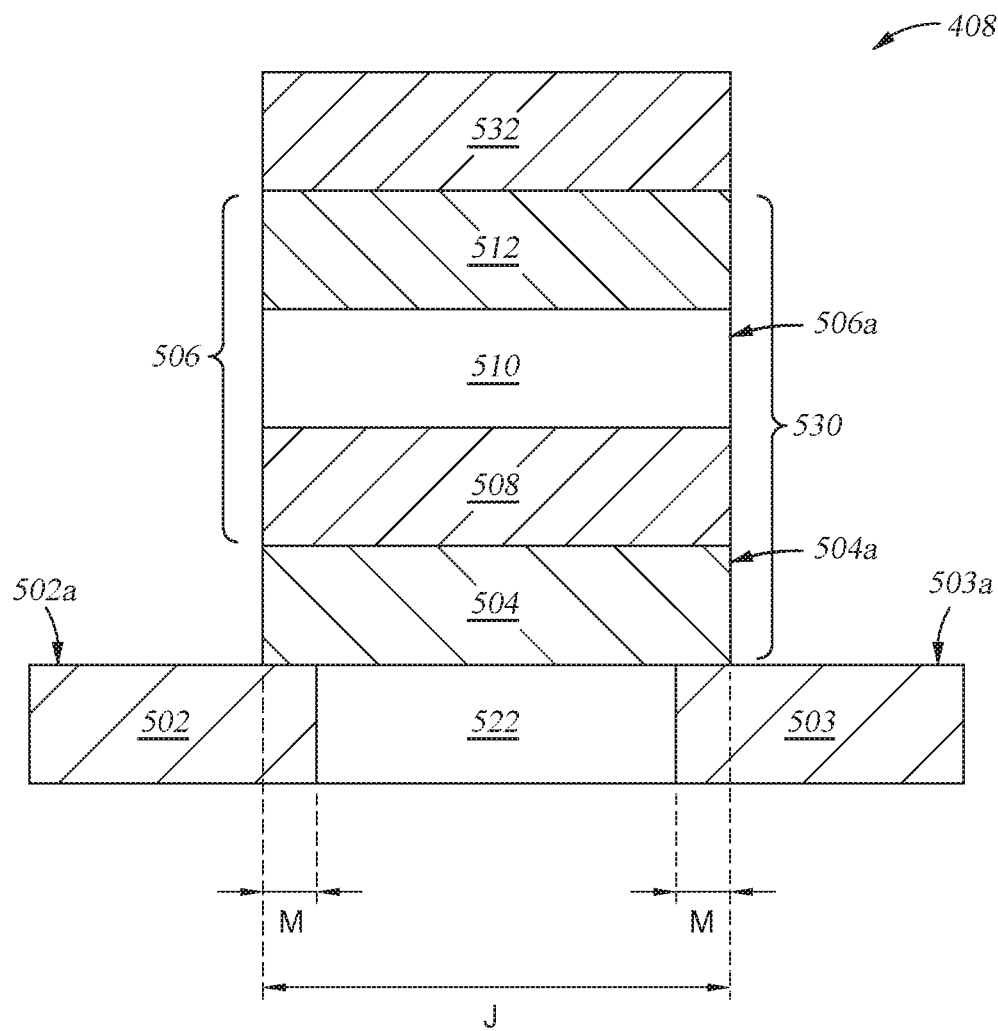

At operation 408, a second patterning process (e.g., an etching process) is performed to pattern the entire film stack 530 exposed by the patterned hardmask layer 532 as shown in FIG. 5D. It is noted that the patterned hardmask layer 532 may be intended to remain upon the film stack 530 in certain embodiments, forming as part of the MTJ stack 506 after the second patterning process performed at operation 408. In other embodiments, the hardmask layer 352 may be removed after the second patterning process by any suitable ash or stripping process.

During the second patterning process, an etching gas mixture or several gas mixtures with different etching species are sequentially supplied into the film stack 530 surfaces to remove the portions of the film stack 530 exposed by the patterned hardmask layer 532. For example, the film stack 530 is exposed to an H2 and O$_2$ plasma etching treatment or an H$_2$ and CO plasma treatment.

The second patterning process may be carried out utilizing the first interconnect structures 502 and 503 as an etch stop layer as compared to the SOT layer 504, which is conventionally used as an etch stop layer and may result in damage thereto, negatively affecting performance of the final SOT-MRAM device or structure. Thus, complexity of the second patterning process is reduced, as the first interconnect structures 502 and 503 are generally thick and may be over-etched without impacting the performance of the final SOT-MRAM device or structure. The patterning of both the MTJ stack 506 and the SOT layer 504 in a single etching process further results in the efficient formation of the MTJ stack 506 and the SOT layer 504 having substantially aligned sidewalls 506a and 504a and reduced footing. As described above, the patterned MTJ stack 506 and SOT layer 504 share a common width J that is substantially uniform throughout the individual layers and overlaps each of the first interconnect structures 502 and 503 by at least a distance M between about 1 Angstrom to about 100 Angstroms. As discussed above, minimizing the distance M of the SOT layer 504 enables an increased active area of the SOT layer 504 and decreased resistance therethrough. Thus, although the SOT layer 504 is patterned to overlap over the first interconnect structures 502 and 503, the overlap is kept minimal.

The end point of the second patterning process at operation 408 may be controlled by time or other suitable method. For example, the patterning process may be terminated after performing the patterning process for between about 200 seconds and about 10 minutes, until the underlying top surfaces 302a and 303a of the first interconnect structures 302 and 303 are exposed, as shown in FIG. 5D. The patterning process may be terminated by determination from an endpoint detector, such as an optoelectronic (OED) detector or other suitable detector as needed.

It is noted that although described and depicted as having a substantially vertical sidewall profile after patterning, the MTJ stack 506 and SOT layer 504 may have tapered sidewalls or any suitable sidewall profiles with desired slopes as needed.

Figure 5E:
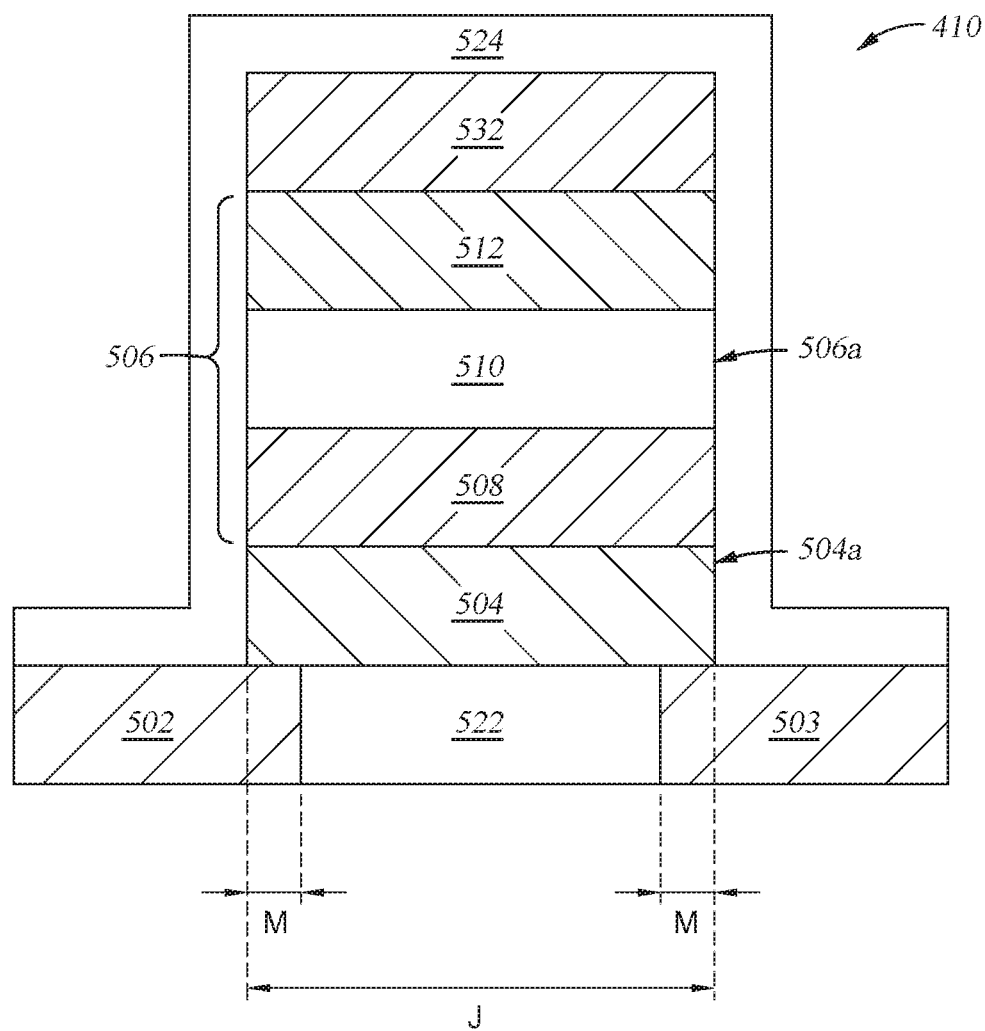

At operation 410 and FIG. 5E, an optional deposition process is performed to form an encapsulation layer 524 over exposed surfaces of the MTJ stack 506 and the SOT layer 504, as well as exposed surfaces of the first interconnect structures 502 and 503 and/or the spacer 522. In certain examples, the encapsulation layer 524 is formed directly over a top surface of the reference layer 512 after removal of the hardmask layer 532. In other examples, the encapsulation layer 524 is formed over the hardmask layer 532 remaining on the reference layer 512. The encapsulation layer 524 may be formed ex-situ or in-situ using PVD, CVD, atomic layer deposition (ALD), or any other suitable processes. The encapsulation layer 524 protects the MTJ stack 506 and the SOT layer 504 during subsequent fabrication operations and use thereof, for example, by preventing oxidation thereof. In certain embodiments, the encapsulation layer 524 is formed of SiN, SiCN, SiON, Al$_2$O$_3$, and/or the like to various thicknesses, for example, from about 5 nm to about 30 nm.

Figure 5F:
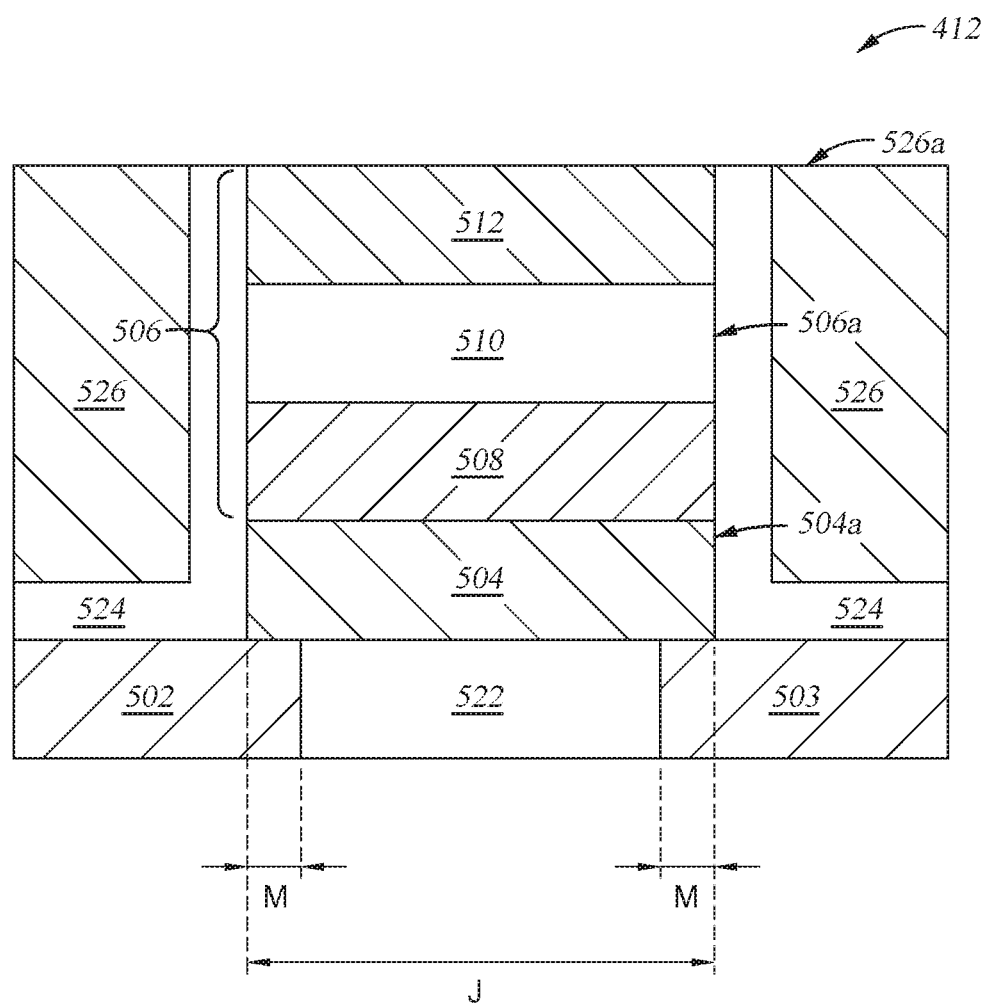

At operation 412, a dielectric fill layer 526 is deposited over the encapsulation layer 524 and planarized as shown in FIG. 5F. The dielectric fill layer 526 can be deposited utilizing any suitable deposition processes, including CVD, PVD, ALD, spin-coating, spray-coating, and the like. The dielectric fill layer 526 is formed from suitable dielectric materials such as low temperature oxides, nitrides, combinations thereof, and the like. During the planarization at operation 412, a portion of the dielectric fill layer 526 can be removed using CMP to form a top surface 526a that is substantially co-planar with a top surface of the encapsulation layer 524, a top surface of the hardmask layer 532, or a top surface of the MTJ stack 506. In certain embodiments, the CMP process may also be utilized to remove a portion of the encapsulation layer 524, as depicted in FIG. 5F. The CMP process as performed may remove the excess dielectric fill layer 526 and/or the encapsulation layer 526 without adversely damaging or over-polishing the nearby materials when the MTJ stack 506 is exposed, such as by utilizing a relatively low polishing downforce and slow polishing rate. As further depicted in FIG. 5F, the hardmask layer 532 has been removed via stripping or ashing and the dielectric fill layer 526 has been planarized to be co-planar with a top surface of the MTJ stack 506.

Figure 5G:
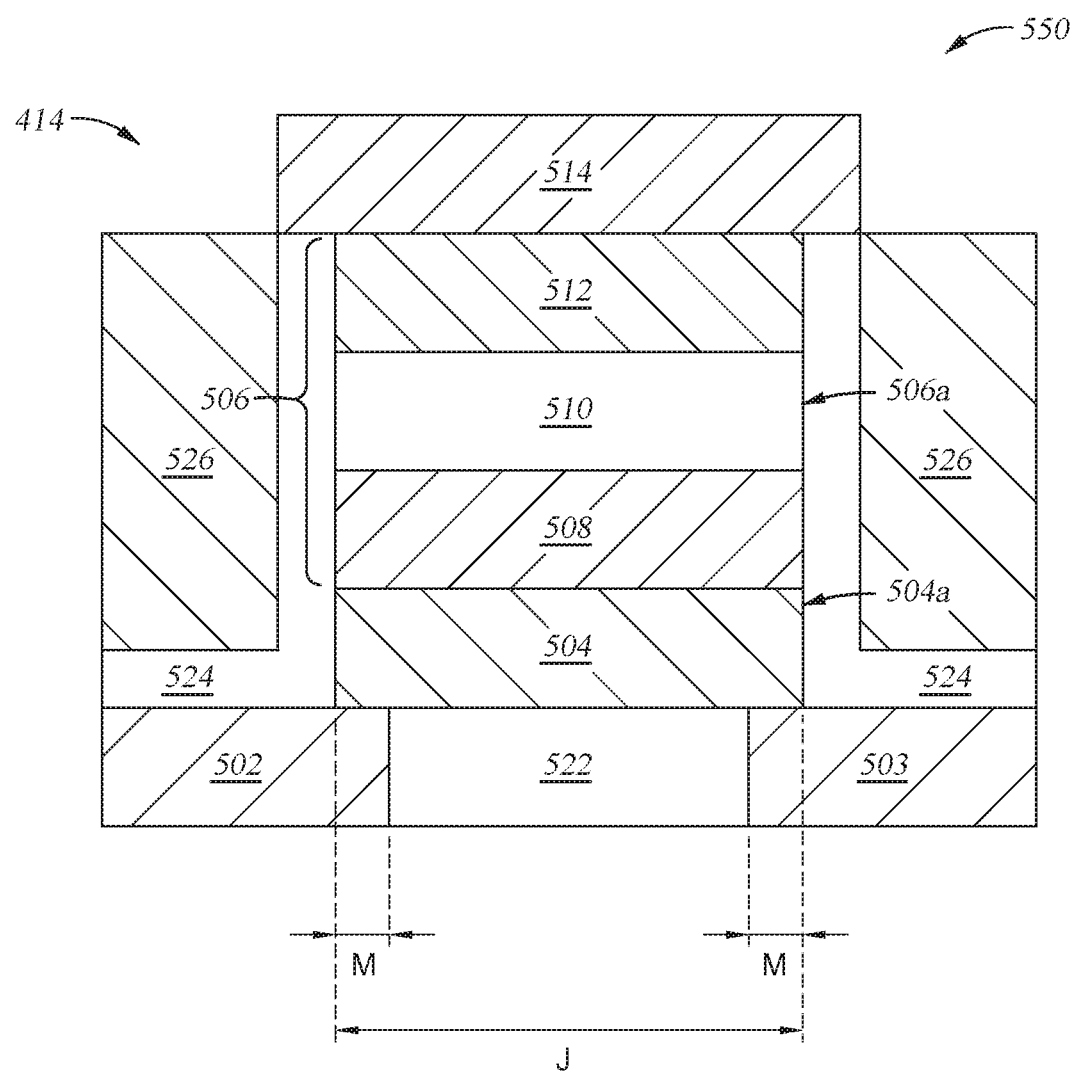

After formation of the dielectric fill layer 526, metal line lithography or any other suitable metal deposition processes may be performed at operation 414 to form one or more second interconnect structures 514 over the MTJ stack 506. As depicted in FIG. 5G, the second interconnect structure 514 is formed over the reference layer 512 of the MTJ stack 506 and can be referred to as a metal line or metal lines, since the second interconnect structure 514 electrically couples to the reference layer 512 and acts to transfer current thereto. In certain embodiments, the second interconnect structure 514 is formed from copper (Cu), tungsten (W), tantalum (Ta), tantalum nitride (TaN), titanium (Ti), titanium nitride (TiN), combinations thereof, or the like.

Upon completion of operation 414, further operations can be executed on SOT-MRAM device 550, including annealing operations. The SOT-MRAM device 550 shown in FIG. 5G is fabricated to withstand further processing at temperatures on the order of 400° C. while maintaining commercially viable electrical and magnetic properties.

The SOT-MRAM devices described herein are fabricated to include an SOT layer laterally aligned with an MTJ stack and formed over a spacer disposed between two interconnect structures. The elimination of the SOT layer outside the area of the MTJ stack causes electric current to pass from the interconnect to the SOT layer by SOT-interconnect overlap, reducing or eliminating the formation of shunting current or current loss and reducing overall SOT line resistance. Additionally, the patterning of the MTJ stack and the SOT layer in a single etch process enables self-alignment of the MTJ with the SOT layer and reduces the formation of defects in the SOT layer caused during conventional processes using the SOT layer as an etch stop.

While the foregoing is directed to embodiments of the present disclosure, other and further embodiments of the disclosure may be devised without departing from the basic scope thereof, and the scope thereof is determined by the claims that follow.

What is claimed is:

1. A magnetoresistive random-access memory (MRAM) device structure, comprising:
    a bottom electrode having a gap therein, the gap separating a first structure and a second structure of the bottom electrode;
    a conductive channel formed over the gap and having an area overlapping each of the first and the second structures of the bottom electrode; and
    a magnetic tunnel junction (MTJ) pillar structure disposed over the conductive channel, the MTJ pillar having a sidewall aligned with a sidewall of the conductive channel;
    a free layer disposed on the conductive channel and having a free magnetization;
    a tunneling barrier layer disposed over the free layer; and
    a reference layer disposed over the tunneling barrier layer and having a fixed magnetic moment;
    an encapsulation layer formed around the MTJ pillar and over the conductive channel, the encapsulation layer comprising silicon nitride (SiN), silicon carbonitride (SiCN), silicon oxynitride (SiON), or aluminum oxide ($Al_2O_3$); and
    a dielectric fill layer formed over the encapsulation layer and having a top surface coplanar with a top surface of the MTJ pillar.

2. The MRAM device structure of claim 1, wherein the gap is filled with an oxide material.

3. The MRAM device structure of claim 2, wherein the gap is filled with a material comprising silicon dioxide.

4. The MRAM device structure of claim 1, wherein the conductive channel overlaps each of the first and the second structures of the bottom electrode by a distance between about 1 Angstrom and 100 Angstroms.

5. The MRAM device structure of claim 1, wherein the dielectric fill layer comprises a low temperature oxide, nitride, or combination thereof.

6. The MRAM device structure of claim 1, further comprising:
    a top electrode formed over the MTJ pillar opposite of the conductive channel.

7. A magnetoresistive random-access memory (MRAM) device structure, comprising:
    a bottom electrode having a gap therein, the gap separating a first conductive structure and a second conductive structure of the bottom electrode;
    a spin-orbit torque (SOT) layer formed over the gap and having an area overlapping each of the first and the second conductive structures of the bottom electrode;
    a magnetic tunnel junction (MTJ) pillar structure disposed over the SOT layer, the MTJ pillar having lateral dimensions substantially equal to the SOT layer, the MTJ pillar further comprising:
    a free layer disposed on the SOT layer and having a free magnetization;
    a tunneling barrier layer disposed over the free layer; and
    a reference layer disposed over the tunneling barrier layer and having a fixed magnetic moment; and
    a top electrode disposed over the MTJ pillar and opposite of the SOT layer;
    an encapsulation layer formed around the MTJ pillar and over the SOT layer, the encapsulation layer comprising silicon nitride (SiN), silicon carbonitride (SiCN), silicon oxynitride (SiON), or aluminum oxide ($Al_2O_3$); and
    a dielectric fill layer formed over the encapsulation layer and having a top surface coplanar with a top surface of the MTJ pillar, the dielectric fill layer comprising a low temperature oxide, nitride, or combination thereof.

8. The MRAM device structure of claim 7, wherein the gap is filled with an oxide material.

9. The MRAM device structure of claim 8, wherein the gap is filled with a material comprising silicon dioxide.

10. The MRAM device structure of claim 7, wherein the SOT layer overlaps each of the first and the second conductive structures of the bottom electrode by a distance between about 1 Angstrom and 100 Angstroms.

* * * * *